(12) United States Patent
Bazil

(10) Patent No.: US 7,362,010 B2
(45) Date of Patent: Apr. 22, 2008

(54) CURRENTS-SENSING SWITCHING CIRCUIT

(75) Inventor: Rodricks Bazil, Roweville (AU)

(73) Assignee: Robert Bosch GmbH, Stuttgart (DE)

( * ) Notice: Subject to any disclaimer, the term of this patent is extended or adjusted under 35 U.S.C. 154(b) by 523 days.

(21) Appl. No.: 10/296,916

(22) PCT Filed: Nov. 15, 2001

(86) PCT No.: PCT/DE01/04284

§ 371 (c)(1),
(2), (4) Date: Aug. 12, 2003

(87) PCT Pub. No.: WO02/41491

PCT Pub. Date: May 23, 2002

(65) Prior Publication Data

US 2004/0027758 A1    Feb. 12, 2004

(30) Foreign Application Priority Data

Nov. 16, 2000    (DE) ................... 100 56 878

(51) Int. Cl.
*H01H 47/00* (2006.01)
*H02B 1/24* (2006.01)

(52) U.S. Cl. .................................... 307/131
(58) Field of Classification Search ............ 307/131
See application file for complete search history.

(56) References Cited

U.S. PATENT DOCUMENTS 5,059,921 A * 10/1991 Vyne et al. ................ 330/261
5,966,005 A * 10/1999 Fujimori .................... 323/315
6,160,364 A * 12/2000 Jo ............................. 315/387
6,384,662 B1 * 5/2002 Thiel et al. ................ 327/514

FOREIGN PATENT DOCUMENTS

| | | |
|---|---|---|
| EP | 0 317 007 | 5/1989 |
| EP | 1 096 262 | 5/2001 |
| JP | 1-212364 | 8/1989 |
| JP | 11-160368 | 6/1999 |
| WO | WO 00/14889 | 3/2000 |

OTHER PUBLICATIONS

"Auto Power Tap With Neat Threshold", IBM Technical Disclosure Bulletin, IBM Corp. New York, U.S., Bd. 37 Nr. 6B Jun. 1, 1994, pp. 615-616, XP000456118, ISSN: 0018-8689.
Ruffel, J. "Slave Mains On-Off Control", Elektor Electronics, Elektor Publishers Ltd., Canterbury, GB, Bd. 16, Nr. 180, Jul. 1, 1990, pp. 532-533, XP000132722, ISSN: 0268-4519.
Ruffel, J. "Slave Mains On-Off Control", Elektor Electronics, Elektor Publishers Ltd., Canterbury, GB, Bd. 17 Nr. 195, Dec. 1, 1990, pp. 60-61, XP000284898, ISSN: 0268-4519.

* cited by examiner

*Primary Examiner*—Michael Sherry
*Assistant Examiner*—Hal I Kaplan
(74) *Attorney, Agent, or Firm*—Kenyon & Kenyon LLP

(57) ABSTRACT

A current-sensing switching circuit includes a first terminal clamp for the current feed for a first unit, based on the state of a second unit the state of which is detected at a second terminal clamp. The first terminal clamp may be switched, based on the current that is picked off at the second terminal clamp.

6 Claims, 4 Drawing Sheets

CURRENTS-SENSING SWITCHING CIRCUIT

FIELD OF THE INVENTION

The present invention is directed to electronic circuits, for example, to an electronic switching circuit for switching the voltage at an output terminal in response to the current that is picked off at a second output terminal.

BACKGROUND INFORMATION

Many electronic systems are designed for continuous operation, so that they are always able to respond to input signals. In order to save energy, these systems often have a rest mode or sleep mode, power only being supplied to those circuits that are essential for detecting input signals and which allow the idle system circuits to be switched on quickly. Input signals are normally detected by an electronic switching circuit supplying current to these idle circuits. For instance, recently introduced keyless locking systems for automobiles are able to lock or unlock automobiles in response to a radio-frequency signal transmitted by a transmitter of an electronic key. The locking circuit includes a self-polling ultra-high frequency (UHF) receiver circuit and an anti-interference, low-noise amplifier (LNA). Since the locking system should be able to respond to UHF signals, the power consumption of the circuits is kept to a minimum so as to prevent the car battery from being drained. The self-polling UHF receiver is able to be switched between a sleep mode and a run mode. The LNA may be switched in tandem so that it is supplied with power only when the UHF receiver is energized.

Conventional systems have achieved this by using a voltage comparator to monitor the output voltage of the UHF receiver circuit. When the UHF receiver switches from sleep state to operating state, the voltage comparator detects the change in the output voltage and supplies current to the LNA. According to this method, the output voltage of the UHF receiver is not well regulated. As a result, the LNA may mistakenly be energized due to electric noise and temperature fluctuations. Moreover, the sensitivity of the system is reduced if the LNA is not switched on in tandem with the UHF receiver.

SUMMARY

It is an object of the present invention to provide a reliable circuit arrangement for the supply of current in response to changes in an electric signal, or to provide at least a useful alternative.

The present invention relates to a current-sensing switching circuit including a first terminal for the supply of current for a first unit, based on the state of a second unit the state of which is detected at a second terminal, and in which the first terminal is switched based on the current picked off at the second terminal.

The second unit may be a high-frequency receiver having a run mode and a sleep mode, which, when in operation, is connected to the second terminal, it being possible that the first unit may be, for example, an LNA. During sleep mode, the picked off current may be below a threshold level and above the threshold level during run mode.

Example embodiments of the present invention are described below with reference to the drawings.

DETAILED DESCRIPTION

Figure 1:
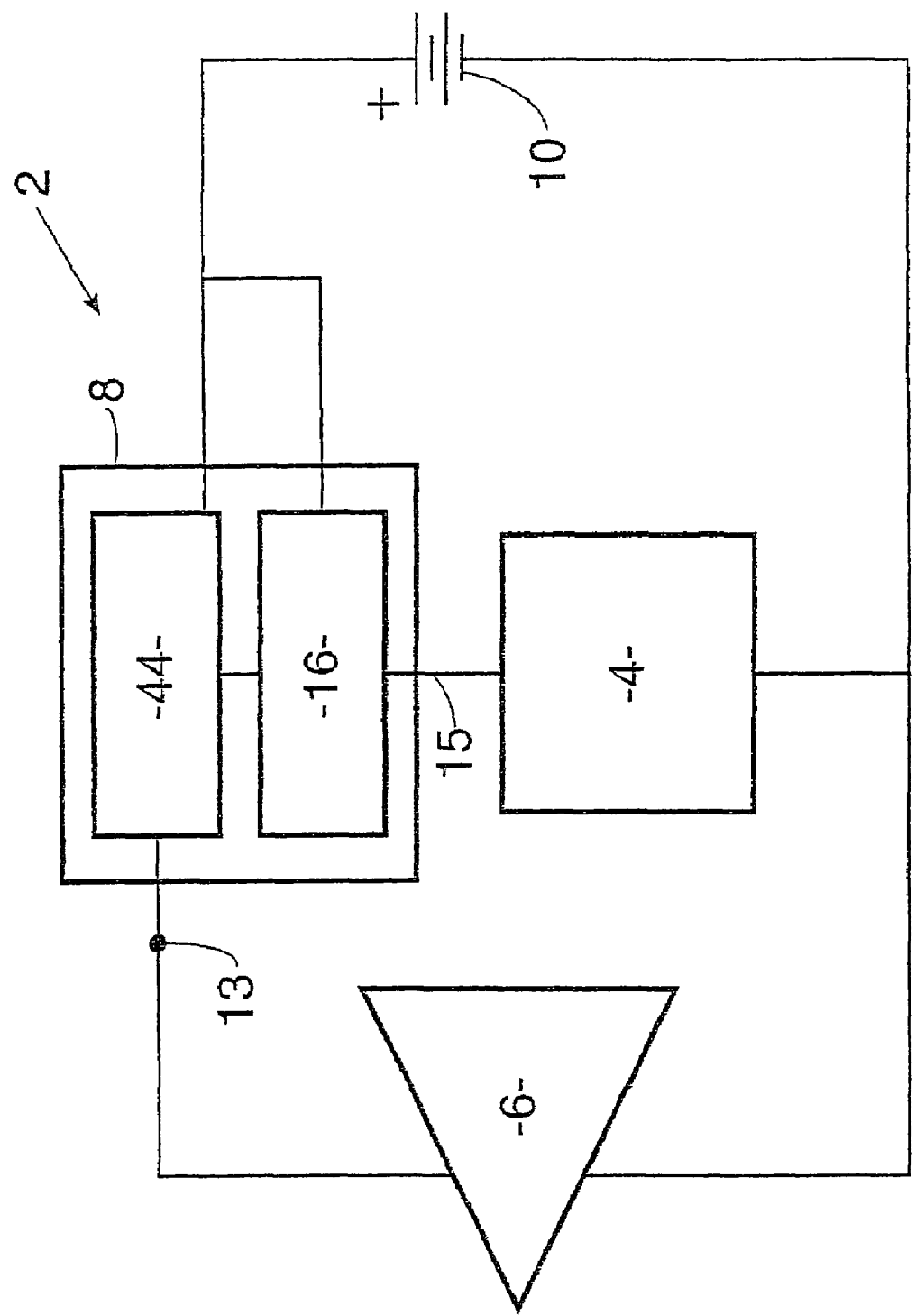
FIG. 1 is a block diagram of an exemplary embodiment of a UHF receiver circuit.

A receiver circuit 2 of a door-locking system of a vehicle as shown in FIG. 1 may include a Motorola Romeo-2 receiver chip 4 for the demodulation of received UHF signals, and an anti-interference, low-noise amplifier (LNA) 6 for the amplification of the demodulated signals. Demodulator 4 has two operating modes: a run mode in which demodulator 4 drains a minimum current of 4 mA from current feed 10 via a load terminal 15, and a sleep mode in which demodulator 4 only drains ≈270 µA. To save energy, terminal clamp 13 energizes the LNA only when demodulator 4 is in run mode. A current-sensing switching circuit 8 accomplishes this by measuring the current which demodulator 4 drains at load terminal 15 and by supplying a voltage that is close to the supply voltage when demodulator 4 is in run mode, and supplying a voltage that is close to zero when demodulator 4 is in sleep mode. A tandem switch, therefore, may ensure that demodulator 4 and LNA 6 run and idle in tandem.

Figure 2:
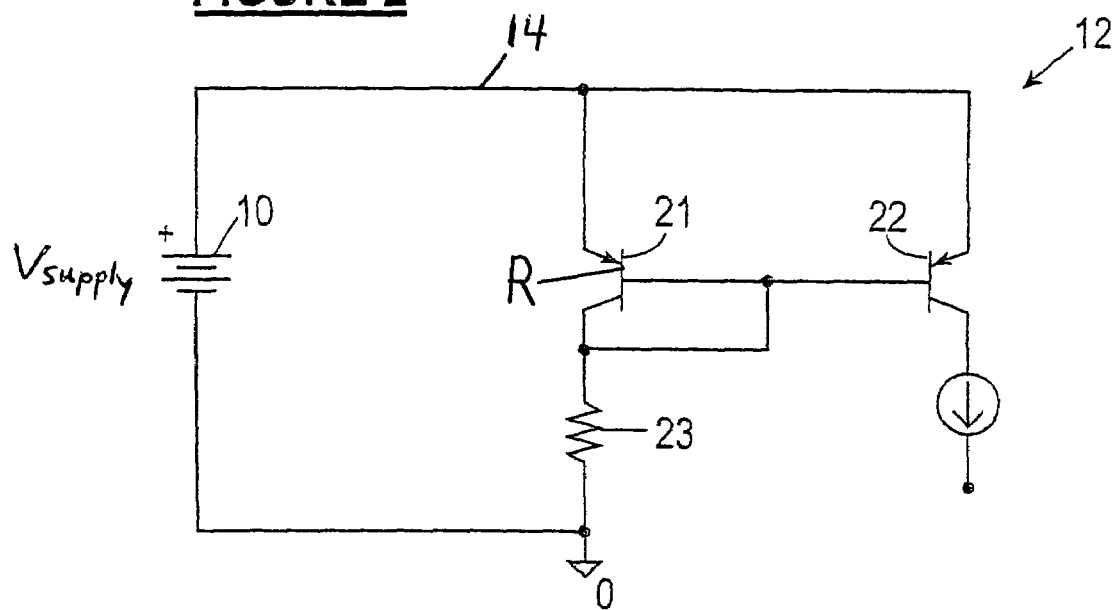
FIG. 2 is a circuit diagram of an exemplary embodiment of a current-mirror circuit.

Current-sensing switching circuit 8 includes a current-sensing circuit 16 and a Vcc switching circuit 44. Current-sensing circuit 16 may be supported by a conventional current-mirror circuit, for example, as a constant current source. As shown in FIG. 2, a conventional current-mirror circuit 12 includes two nominally identical pnp transistors 21 and 22 (Siemens BC8568) the emitters of which are connected to a common supply-voltage bus bar 14, and the bases of which are directly connected to one another. The collector of first transistor 21 is short-circuited with the base and grounded by a resistor 23. The collector of second transistor 22 provides the output of the electric circuit and is connected to an external load. The current flowing through first transistor 21 is given by $I=(V_{supply}-V_{BE})/R$. Since the base emitter transition junctions of both transistors may be identically forward-biased, the same current may flow through both transistors, and the collector current of second transistor 22 thus provides a constant current source.

Figure 3:
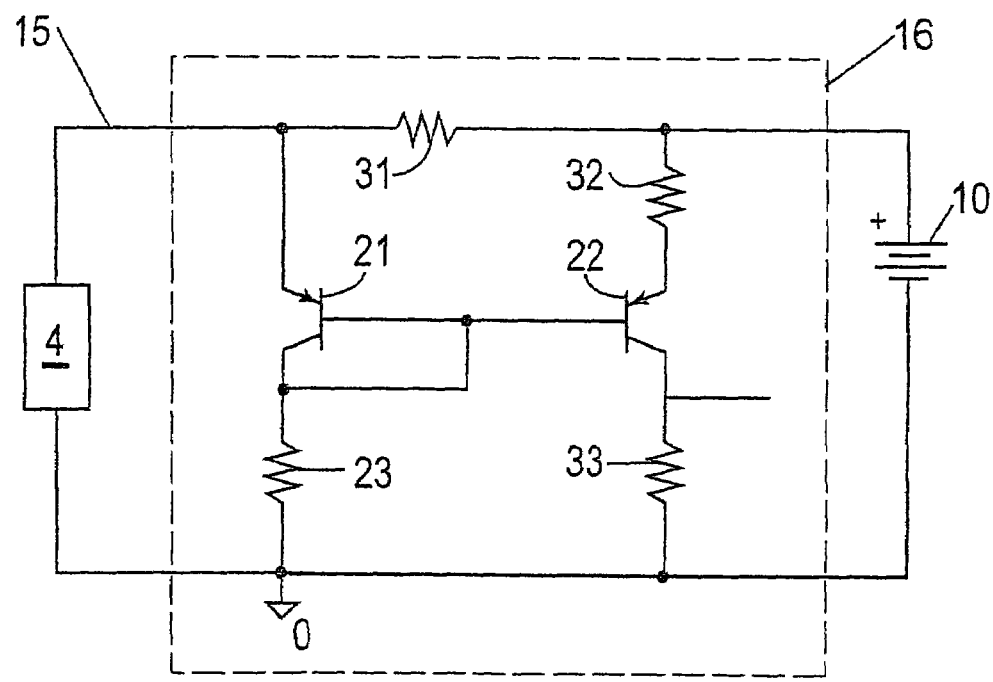
FIG. 3 is a circuit diagram of an exemplary embodiment of a current-sensing circuit of the UHF receiver circuit.
Figure 4:
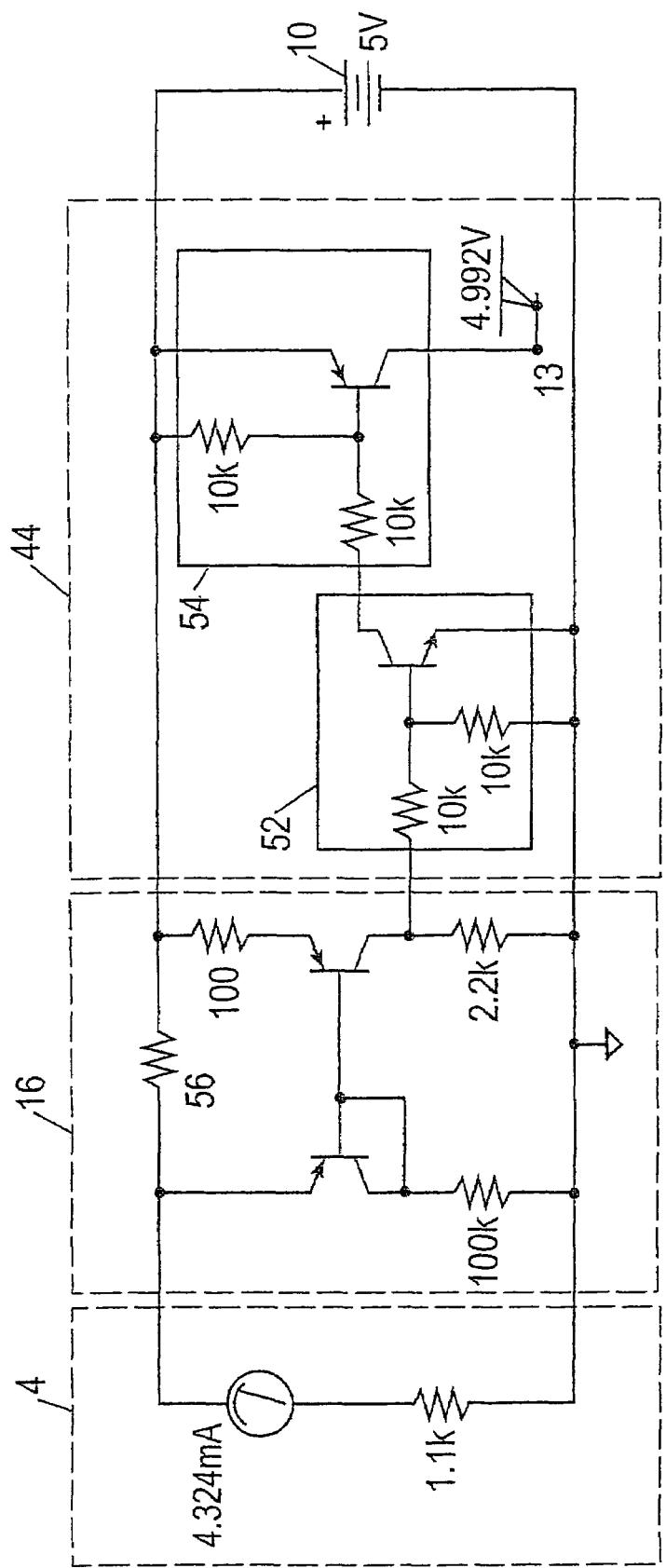
FIG. 4 is a circuit diagram of a circuit arrangement of an exemplary embodiment of a current-sensing switching circuit and a UHF modulator in run mode.
Figure 5:
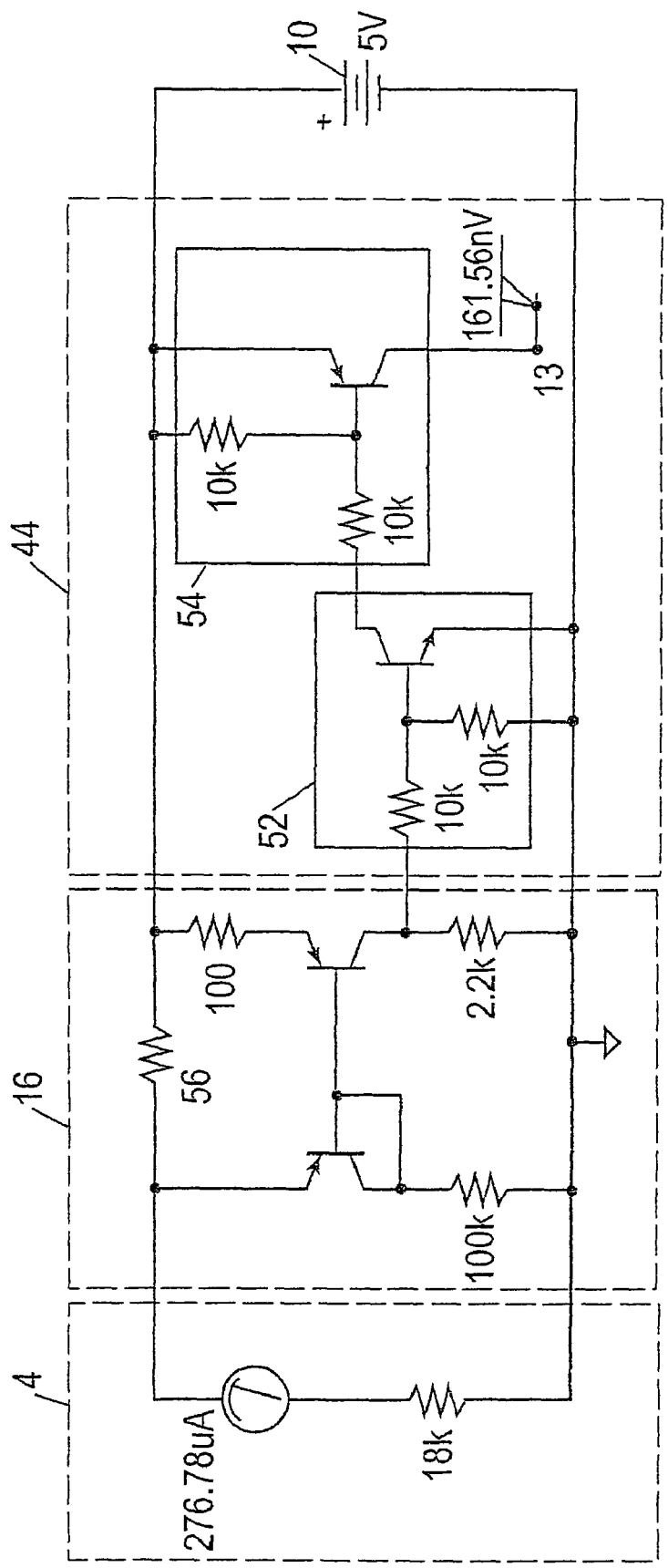
FIG. 5 is a circuit diagram of a circuit arrangement of an example embodiment of a current-sensing switching circuit and a UHF modulator in sleep mode.

Current-sensing circuit 16 may be a modified mirror circuit, as shown in FIG. 3, including a current-sensing resistor 31 in the supply bus bar between the emitters of the two transistors 21 and 22, a third resistor 32 between the supply bus bar and the emitter of second transistor 22, and a fourth resistor 33 between the collector of second transistor 22 and ground. The presence of current-sensing resistor 31 and of third resistor 32 causes an asymmetry in the emitter potentials of the two transistors, which is a function of the current drained by load 4. The relative current flowing through first transistor 21 and second transistor 22 may be determined by the relative values of current-sensing resistor 31 and third resistor 32 as well. The resulting output voltage via fourth resistor 33 bears the same relationship to the load current. This output voltage may be used in current-sensing switching circuit 8 to operate Vcc switching circuit 44, as shown in FIGS. 4 and 5. As a result, the resistances are selected according to the switching characteristics of this circuit. To be more specific: the value of third resistor 32 may be selected such that, in the unloaded state (i.e., in sleep mode), the voltage via fourth resistor 33 is lower than the lower threshold voltage required to activate Vcc switching circuit 44. The value of current-sensing resistor 31 may be selected such that, given a normal load (i.e., in run mode), the output voltage via fourth resistor 33 is greater than the upper threshold voltage level required to activate Vcc switching circuit 44. For circuit 2, these voltages are 200 mV or 2V via fourth resistor 33.

FIGS. 4 and 5 illustrate exemplary embodiments of a receiving circuit, which supplies the current to external LNA 6 for the, for example, two Motorola Romeo-2 demodulators 4 used and that run in the run or sleep mode. It is possible to divide these circuits into three logical blocks: a load 4, current-sensing circuit 16 and Vcc switching circuit 44. As described above, the output voltage of current-sensing circuit 16 is proportional to the current drained by load block 4. This output voltage may be used to operate Vcc switching circuit 44, which provides a connected output at terminal clamp 13. The output voltage of current-sensing circuit 54 is run via an npn-transistor inverter. Switching circuit 54 switches current feed 10 of terminal clamp 13 of external LNA 6 when demodulator 4 is in run mode.

FIG. 4 shows demodulator 4 with an effective load of 1.1 kΩ and a current drain of 4.3 mA in run mode. Output 13 is 4.992 V of a supply voltage of 5.000 V. In sleep mode, as shown in FIG. 5, demodulator 4 has a load of 18 kΩ and drains a current of less than 0.3 mA. The corresponding output voltage at terminal clamp 13, at ≈152 nV, is low. From this it may be inferred that, when demodulator 4 switches from sleep mode to run mode, the output voltage changes from ≈152 nV to 4.992 V, which may also be expressed as a change from 0.0 to 5.0 V. If terminal clamp 13 is used to switch on external LNA 6 in FIG. 1, LNA 6 may be energized when demodulator 4 is in run mode. Demodulator 4 and LNA 6 are switched on in tandem.

The example current-sensing switching circuit 8 described above includes an operating current of a switching element that is a more reliable indicator of the working state than the output voltage since it is less sensitive to electrical noise or temperature fluctuations. The current-sensing switching circuit according to the present invention may be very stable across a large temperature range if a matched transistor pair is used that is produced on a single substrate. Moreover, the current-sensing switching circuit may be less costly than a voltage-sensing switching circuit.

What is claimed is:

1. A receiver circuit for a vehicle, comprising:
  a current-sensing switching circuit including:
    a first terminal clamp for a current supply of a first unit based on a state of a second unit;
    a second terminal clamp configured to detect the state of the second unit;
      wherein the first terminal clamp is configured to be switched on the basis of a current picked off at the second terminal clamp, the first unit including an amplifier, the second unit including a high-frequency receiver;
    a switching circuit configured to switch the first terminal clamp;
    a current-mirror system including potential-dividing resistors configured to generate a voltage proportional to the current at the second terminal clamp to control the switching circuit;
    a first transistor including a short-circuited base and collector;
    a first load resistor that provides a first branching of the mirror system; and
    a second transistor and a second load resistor that provides a second branching of the mirror system;
      wherein voltage-dividing resistors are connected between emitters of the transistors and are connected to the current supply between the voltage-dividing resistors, the switching circuit being connected to the collector of the second transistor, and the second terminal clamp being arranged as an emitter of the first transistor.

2. The receiver circuit according to claim 1, wherein the second unit includes a run mode and a sleep mode and is connected to the second terminal clamp when in operation, the current being below a threshold level during sleep mode and above the threshold level during run mode.

3. The receiver circuit according to claim 1, wherein the first and second transistors are arranged as a matched pair on a same substrate.

4. A vehicle, comprising:
  a receiver circuit for a vehicle including a current-sensing switching circuit, the current-sensing switching circuit including:
    a first terminal clamp for a current supply of a first unit based on a state of a second unit;
    a second terminal clamp configured to detect the state of the second unit;
      wherein the first terminal clamp is configured to be switched on the basis of a current picked off at the second terminal clamp, the first unit including an amplifier, the second unit including a high-frequency receiver;
    a switching circuit configured to switch the first terminal clamp;
    a current-mirror system including potential-dividing resistors configured to generate a voltage proportional to the current at the second terminal clamp to control the switching circuit;
    a first transistor including a short-circuited base and collector;
    a first load resistor that provides a first branching of the mirror system; and
    a second transistor and a second load resistor that provides a second branching of the mirror system;
      wherein voltage-dividing resistors are connected between emitters of the transistors and are connected to the current supply between the voltage-dividing resistors, the switching circuit being connected to the collector of the second transistor, and the second terminal clamp being arranged as an emitter of the first transistor.

5. The vehicle according to claim 4, wherein the second unit includes a run mode and a sleep mode and is connected to the second terminal clamp when in operation, the current being below a threshold level during sleep mode and above the threshold level during run mode.

6. The vehicle according to claim 4, wherein the first and second transistors are arranged as a matched pair on a same substrate.

* * * * *